(12) United States Patent
Matsuo et al.

(10) Patent No.: US 11,339,309 B2
(45) Date of Patent: May 24, 2022

(54) POLISHING LIQUID AND POLISHING METHOD (71) Applicant: Mitsui Mining & Smelting Co., Ltd., Tokyo (JP)

(72) Inventors: Ken Matsuo, Omuta (JP); Masayuki Matsuyama, Omuta (JP); Mikimasa Horiuchi, Omuta (JP); Akinori Kumagai, Omuta (JP)

(73) Assignee: Mitsui Mining & Smelting Co., Ltd.

( * ) Notice: Subject to any disclaimer, the term of this patent is extended or adjusted under 35 U.S.C. 154(b) by 0 days.

(21) Appl. No.: 16/461,578

(22) PCT Filed: Aug. 15, 2017

(86) PCT No.: PCT/JP2017/029370
§ 371 (c)(1),
(2) Date: May 16, 2019

(87) PCT Pub. No.: WO2018/116521
PCT Pub. Date: Jun. 28, 2018

(65) Prior Publication Data
US 2019/0367776 A1 Dec. 5, 2019

(30) Foreign Application Priority Data
Dec. 22, 2016 (JP) .............................. JP2016-249129

(51) Int. Cl.
*C09G 1/02* (2006.01)
*C08K 3/013* (2018.01)
(Continued)

(52) U.S. Cl.
CPC ................ *C09G 1/02* (2013.01); *C08K 3/013* (2018.01); *C08K 5/19* (2013.01); *C08L 1/10* (2013.01);
(Continued)

(58) Field of Classification Search
CPC .... C09G 1/02; C08L 1/10; C08K 5/19; C08K 3/013; C08K 2003/2262; C09K 2109/00;
(Continued)

(56) References Cited

U.S. PATENT DOCUMENTS 6,022,400 A * 2/2000 Izumi .................... B24B 53/017
106/3
2004/0067640 A1* 4/2004 Hsu ................... H01L 21/76877
438/637
(Continued)

FOREIGN PATENT DOCUMENTS

CN 102337082 A 2/2012
CN 104385116 A 3/2015
(Continued)

Primary Examiner — Binh X Tran
(74) Attorney, Agent, or Firm — Harness, Dickey & Pierce, P.L.C.

(57) ABSTRACT

A polishing liquid is provided containing manganese oxide abrasive grains, permanganate ions, and a cellulosic surfactant or a cationic surfactant. The polishing liquid has a pH of 5 or more and 11 or less. The cellulosic surfactant is preferably a carboxymethyl cellulose or a derivative thereof. The cationic surfactant preferably has a quaternary ammonium ion site. The content of the cellulosic surfactant or the cationic surfactant is preferably 0.01 mass % or more and 1.0 mass % or less based on the total amount of the polishing liquid.

1 Claim, 1 Drawing Sheet (51) Int. Cl.
*C08K 5/19* (2006.01)
*C08L 1/10* (2006.01)
C08K 3/22 (2006.01)
C09K 109/00 (2006.01)

(52) U.S. Cl.
CPC .. *C08K 2003/2262* (2013.01); *C09K 2109/00* (2013.01)

(58) Field of Classification Search
CPC ... C09K 3/14; H01L 21/304; H01L 21/30625; H01L 21/02024; B24B 37/00
See application file for complete search history.

(56) References Cited

U.S. PATENT DOCUMENTS

| | | | |
|---|---|---|---|
| 2006/0000808 A1* | 1/2006 | Seki | C09G 1/04 216/88 |
| 2008/0173843 A1 | 7/2008 | Hotta et al. | |
| 2010/0258528 A1 | 10/2010 | Singh et al. | |
| 2012/0240479 A1* | 9/2012 | Doi | H01L 21/02024 51/309 |
| 2014/0242750 A1 | 8/2014 | Sato et al. | |
| 2016/0060488 A1* | 3/2016 | Singh | C09K 3/1436 216/53 |
| 2016/0133465 A1 | 5/2016 | Sasaki | |
| 2016/0257854 A1* | 9/2016 | Omori | C09K 3/1463 |
| 2017/0226381 A1* | 8/2017 | Lan | C09K 3/1436 |
| 2017/0321098 A1* | 11/2017 | Takahashi | C09G 1/02 |
| 2017/0355881 A1* | 12/2017 | Tamai | C09K 3/14 |

FOREIGN PATENT DOCUMENTS

| | | |
|---|---|---|
| JP | 2012-248569 A | 12/2012 |
| JP | 2015-005702 A | 1/2015 |
| JP | 2015-229748 A | 12/2015 |
| WO | WO-2013-054883 A1 | 4/2013 |
| WO | WO-2016-158328 A1 | 10/2016 |

* cited by examiner

POLISHING LIQUID AND POLISHING METHOD

CROSS-REFERENCE TO RELATED APPLICATIONS

This application is a U.S. National Stage Application of International Application No. PCT/JP2017/029370, filed on Aug. 15, 2017, and claims priority to Japanese Patent Application No. 2016-249129, filed on Dec. 22, 2016. The entire disclosures of the above applications are expressly incorporated herein by reference.

BACKGROUND

Technical Field

The present invention relates to a polishing liquid that contains manganese oxide abrasive grains and permanganate ions, and a polishing method that uses the polishing liquid.

Related Art

In the field of power semiconductor devices, also called power devices, which are a type of semiconductor devices, the use of silicon carbide (SiC), gallium nitride, diamond, and the like is proposed, instead of silicon that is conventionally used for substrates, for the purpose of coping with the trends toward high-voltage and large electric currents. Substrates made of these materials have a wider band gap than that of silicon substrates, and thus can withstand higher voltages. In particular, silicon carbide substrates, which have excellent hardness, heat resistance, chemical stability, cost-performance, and other properties, are widely used as a material for semiconductor devices.

A SiC substrate is obtained, for example, in the following manner: an ingot made of bulk single crystalline SiC is ground into a cylindrical shape; the cylindrical ingot is sliced up using a wire-saw or the like to provide a SiC disc; the outer circumferential portion of the SiC disc is chamfered to have a predetermined diameter; the surface of the resulting disc-shaped SiC substrate is ground by a mechanical grinding method so as to flatten out irregularities and make the surface flat; and then, mechanochemical polishing according to, for example, a CMP (chemical mechanical polishing) method is performed on the surface of the substrate to provide a mirror-finished surface. In the process of producing a SiC substrate, polishing according to the CMP method is widely used for removing roughness and unevenness of the surface of the SiC substrate or for flattening out irregularities due to wiring on the wafer formed by stacking an epitaxial layer on the surface of the SiC substrate.

It is known that, due to the crystal structure of silicon carbide, a silicon carbide substrate normally has a C face, in which C atoms are arranged on a surface, on one side, and a Si face, in which Si atoms are arranged on a surface, on the other side that opposes the one side. Accordingly, in polishing a silicon carbide substrate, if both the Si face and the C face are simultaneously polished using a single polishing liquid, the polishing rate on the Si face and that on the C face normally differ from each other (normally, C face:Si face=3:1). For this reason, two types of polishing liquids (i.e., a polishing liquid for polishing the Si face and that for polishing the C face) are normally provided, and the Si face and the C face are polished separately therewith.

However, in order to improve the efficiency of the polishing process, it has been desired to perform polishing on both sides of a silicon carbide substrate, especially, double-sided polishing (i.e., simultaneously polishing both sides of a silicon carbide substrate), using a single polishing liquid.

As a method for polishing both sides of a SiC substrate, US2016133465A1 discloses a CMP method in which double-sided polishing is performed on both the C face and an epitaxial film formed on the Si face of a SiC substrate using alumina as a polishing agent and potassium permanganate as an oxidizing agent in a processing selectivity ratio between the C face and the epitaxial film-formed Si face of 3.0 or more.

Also, JP 2015-229748A discloses a method that uses a CMP polishing liquid that contains a polishing material, a vanadate, and an oxygen donating agent, wherein polishing material particles for the polishing material are particles having a core-shell structure whose core layer and shell layer contain an oxide of aluminum (Al) or the like and cerium oxide, respectively.

The reason why single-sided polishing is conventionally performed generally on a SiC substrate rather than double-sided polishing, is that, as described above, most conventionally used polishing liquids provide a polishing rate on the C face significantly higher than that on the Si face, and specifically that such a higher polishing rate on the C face causes warpage (a concave C face of the polished SiC substrate) due to the Twyman effect which easily brings about cracking.

The invention disclosed in US2016133465A1 is intended to minimize the removal of the epitaxial layer formed on the Si face and also to remove the roughness of the C face; however, as described above, it requires the processing selectivity ratio between the C face and the Si face (in other words, the ratio between the polishing rate on the C face and that on the Si face) to be as large as 3 or more. Thus, it can be said that this is rather a technique completely opposite to the solution for preventing cracking that is likely to occur in a polished SiC substrate due to the Twyman effect.

Also, in JP 2015-229748A, the polishing rate ratio (C face/Si face) of most CMP polishing liquids Nos. 1 to 10 of Examples shown in Table 1 of Patent Literature 2 is 3.0 or more. As can be seen from this, the technique of JP 2015-229748A is not sufficient to provide a polishing rate ratio (C face/Si face) close to a value of 1 to thereby prevent the occurrence of warpage and cracking caused by the warpage in the polished SiC substrate.

It is an object of the present invention to provide a polishing liquid that can overcome various disadvantages of the above-described conventional technique, and a method for producing a polished article by using the polishing liquid.

SUMMARY

The present invention provides a polishing liquid that contains: manganese oxide abrasive grains; permanganate ions; and a cellulosic surfactant or a cationic surfactant, wherein the polishing liquid has a pH of 5 or more and 11 or less.

Also, the present invention provides a polishing method that uses the polishing liquid.

DETAILED DESCRIPTION OF THE PREFERRED EMBODIMENTS

Hereinafter, the present invention will be described by way of preferred embodiments thereof. The present embodiment relates to a polishing liquid that contains permanganate ions as well as manganese oxide abrasive grains and a cellulosic surfactant or a cationic surfactant, and has a pH of 5 or more and 11 or less.

A feature of the polishing liquid according to the present embodiment is that the polishing liquid contains manganese oxide as abrasive grains. This feature tends to allow the ratio of the polishing rate on the C face to that on the Si face (hereinafter referred to as "C/Si polishing rate ratio") provided by the polishing liquid according to the present embodiment to be a value close to 1 easily, as compared with a polishing liquid containing silica abrasive grains or alumina abrasive grains, which are often used to polish a silicon carbide substrate, and, thus this feature can easily prevent warpage caused by the Twyman effect and cracking caused by the warpage.

Examples of manganese oxide include manganese(II) oxide (MnO), dimanganese(III) trioxide ($Mn_2O_3$), manganese(IV) dioxide ($MnO_2$), and trimanganese(II, III) tetroxide ($Mn_3O_4$). These may be used singly or in a combination of two or more.

In addition to the manganese oxide abrasive grains, the polishing liquid may contain other abrasive grains as long as the effects of preventing warpage caused by Twyman effect and cracking caused by the warpage are not impaired. Examples of materials of the other abrasive grains include alumina, silica, cerium oxide, zirconium oxide, iron oxide, silicon carbide, and diamond. These may be used singly or in a combination of two or more.

The abrasive grains preferably have a particle size at 50% cumulative volume percentage ($D_{50}$) of 0.1 μm or more in the particle size distribution determined by a laser diffraction/scattering method, in view of a high polishing force, and preferably 5.0 μm or less in view of suppressing the roughness of the wafer surface. In view of these, the abrasive grains more preferably have a particle size at 50% cumulative volume percentage ($D_{50}$) of 0.15 μm or more and 4.5 μm or less, and even more preferably 0.2 μm or more and 4.0 μm or less, in the particle size distribution determined by a laser diffraction/scattering. Specifically, the particle size $D_{50}$ is determined according to a method described in Examples given below. Abrasive grains have a different degree of aggregation due to zeta potential, which will be described later, and the particle size $D_{50}$ is a particle size taking the degree of aggregation into consideration.

In view of increasing the polishing rate when polishing a high-hardness material such as silicon carbide, ensuring preferred fluidity of the abrasive grains in the polishing liquid, and preventing aggregation, the content of manganese oxide abrasive grains in the polishing liquid of the present invention is preferably 0.1 mass % or more and 10 mass % or less, more preferably 0.2 mass % or more and 8 mass % or less, and even more preferably 0.3 mass % or more and 5 mass % or less based on the total amount of the polishing liquid. Herein, the content or amount of a component in the polishing liquid of the present invention refers to that before polishing is performed, unless otherwise stated.

The polishing liquid of the present invention, which contains both manganese oxide abrasive grains and permanganate ions ($MnO_4^-$), can provide a high polishing force to a high-hardness material such as silicon carbide. The permanganate ions ($MnO_4^-$) are supplied from a permanganate. Examples of the permanganate include an alkali metal salt of permanganic acid, an alkaline earth metal salt of permanganic acid, and an ammonium salt of permanganic acid. In view of ease of availability and the improvement in the polishing efficiency of the polishing slurry according to the present invention, it is preferable to use an alkali metal salt of permanganic acid as the permanganate that serves as the source of permanganate ions ($MnO_4^-$). In particular, sodium permanganate or potassium permanganate is more preferable. These may be used singly or in a combination of two or more.

In view of sufficiently increasing the effect of suppressing the reduction of the polishing rate caused by the use of a weak acid and a soluble salt of the weak acid, the content of permanganate ions ($MnO_4^-$) in the polishing liquid is preferably 0.1 mass % or more based on the total amount of the polishing liquid. The content of permanganate ions ($MnO_4^-$) in the polishing liquid is more preferably 20.0 mass % or less based on the total amount of the polishing liquid in view of safe handling of the polishing liquid and the tendency for the polishing rate to level off even when the amount used is increased. In view of these, the content of permanganate ions ($MnO_4^-$) is preferably 0.1 mass % or more and 20.0 mass % or less, and more preferably 1.0 mass % or more and 10 mass % or less based on the total amount of the polishing liquid. The content of permanganate ions ($MnO_4^-$) can be measured using an ion chromatography or an absorption spectrophotometry.

Another feature of the polishing liquid according to the present embodiment is that the polishing liquid contains a cellulosic surfactant or a cationic surfactant. The inventors of the present invention have found that a polishing liquid that contains the above-described specific abrasive grains at a pH in a specific range and also contains the above-described specific type of surfactant can provide a C/Si polishing rate ratio close to 1 while increasing the polishing rates on the C face and on the Si face, and that warpage caused by the Twyman effect and cracking caused by the warpage can thus be effectively prevented. As can be seen from Comparative Examples 4 to 7 described below, the polishing rate on the Si face decreases significantly to thereby fail to provide the above-described effect, when a surfactant other than the specific types of surfactants according the present invention is used.

The cellulosic surfactant refers to a cellulose derivative that functions as a surfactant.

Examples of known cellulosic surfactants include an anion cellulosic surfactant, a cation cellulosic surfactant, and a nonionic cellulosic surfactant. As the anion cellulosic surfactant, an anion surfactant obtained by introducing an anionic group such as a carboxyl group, an alkoxyl group, or a hydroxyl group into the cellulose backbone may be used. As the cation cellulosic surfactant, a cationized cellulose may be used. Examples of the nonionic cellulosic surfactant include alkyl cellulose such as ethyl cellulose, hydroxyethyl cellulose, hydroxypropyl cellulose, hydroxyethyl methyl cellulose, and hydroxypropyl methyl cellulose. As the cellulosic surfactant, it is preferable to use an anion cellulosic surfactant, in particular, an anion surfactant that contains a carboxyl group, and it is even more preferable to use a carboxymethyl cellulose or a derivative thereof. The carboxymethyl cellulose is a compound having carboxymethyl groups bonded to a portion of hydroxyl groups of glucopyranose monomers that constitute the cellulose backbone. Examples of the carboxymethyl cellulose derivative include alkali metal salts of carboxymethyl cellulose, specifically, salts such as a sodium salt and a potassium salt of carboxymethyl cellulose. Also, as the carboxymethyl cellulose derivative, it is possible to use a carboxymethyl cellulose derivative having a hydroxyalkyl group, an alkyl group, or the like bonded as a side chain thereof, as long as the surface activity of carboxymethyl cellulose is not impaired. Other examples of the cellulosic surfactant include crystalline cellulose and a modified product thereof (for example, Avicel® available from Asahi Kasei Corporation).

For the carboxymethyl cellulose or the derivative thereof as the surfactant, the degree of etherification is preferably 0.1 to 2.0, more preferably 0.2 to 1.0, and even more preferably 0.3 to 0.8, in view of providing a C/Si polishing rate ratio close to 1. As used herein, the degree of etherification of a carboxymethyl cellulose or a derivative thereof is an indicator of the number (average value) of carboxymethyl groups introduced in one anhydroglucose unit. Because one anhydroglucose unit has three hydroxy groups, the maximum number of carboxymethyl groups introduced, or in other words, the maximum value of the degree of etherification is 3.0. The carboxymethyl group herein encompasses groups formed by substituting a carboxymethyl group with a metal ion, such as a sodium carboxymethyl group.

Examples of the cationic surfactant include an amine salt surfactant and a quaternary ammonium salt surfactant. The cationic surfactant is preferably a cationic surfactant that has a quaternary ammonium ion site. The cationic surfactant that has a quaternary ammonium ion site may be a salt represented by the following general formula (1).

Chem. 1

(1)

wherein each of $R_1$, $R_2$, $R_3$, and $R_4$ independently represents an alkyl group, an aryl group or an arylalkyl group, or $R_1$, $R_2$, and $R_3$ bond to each other to form a pyridine ring, $R_4$ represents an alkyl group, an aryl group, or an arylalkyl group, and $X^-$ represents a monovalent anion.

In the general formula (1) given above, the alkyl group represented by $R_1$, $R_2$, $R_3$, and $R_4$ is preferably an alkyl group with 1 to 20 carbon atoms. Specific examples thereof include a methyl group, an ethyl group, a propyl group, an isopropyl group, an n-butyl group, an s-butyl group, a t-butyl group, an isobutyl group, an amyl group, an isoamyl group, a t-amyl group, a hexyl group, a heptyl group, an isoheptyl group, a t-heptyl group, an n-octyl group, an isooctyl group, 2-ethylhexyl group, a t-octyl group, a nonyl group, an isononyl group, a decyl group, an isodecyl group, an undecyl group, a dodecyl group, a tridecyl group, an isotridecyl group, a tetradecyl group, a hexadecyl group, an octadecyl group, and an icosyl group, and among these, straight chain groups are preferable. The aryl group represented by $R_1$, $R_2$, $R_3$, and $R_4$ is preferably a phenyl group. The arylalkyl group represented by $R_1$, $R_2$, $R_3$, and $R_4$ may be a benzyl group, a phenethyl group, or the like. The monovalent anion represented by $X^-$ may be a halide ion. Preferred examples of the halide ion include a chloride ion and a bromide ion. The aromatic ring in the aryl group or the arylalkyl group represented by $R_1$, $R_2$, $R_3$, and $R_4$ and the pyridine ring formed as a result of $R_1$, $R_2$, and $R_3$ bonding to each other may be substituted with an alkyl group or an amino group, and the methylene group in the alkyl group in the arylalkyl group may be replaced by —O—. The pyridine ring formed as a result of $R_1$, $R_2$, and $R_3$ bonding to each other may be condensed with a benzene ring.

Preferred examples of the cationic surfactant represented by the general formula (1) include distearyl dimethyl ammonium chloride (rational formula: $C_{18}H_{37}N^+C_{18}H_{37}(CH_3)_2 \cdot Cl^-$), benzalkonium chloride (rational formula: $C_6H_5CH_2N^+(CH_3)_2RCl^-$ (R=$C_8H_{17}$ to $C_{18}H_{37}$, long-chain alkyl)), benzethonium chloride (molecular formula: $C_{27}H_{42}ClNO_2$), cetylpyridinium chloride (molecular formula: $C_{21}H_{38}NCl$), hexadecyltrimethylammonium bromide (rational formula: $(C_{16}H_{33})N^+(CH_3)_3Br^-$), and dequalinium chloride (molecular formula: $C_{30}H_{40}Cl_2N_4$).

The content of the cellulosic surfactant or the cationic surfactant is preferably 0.01 mass % or more based on the total amount of the polishing liquid in view of further increasing the polishing rate. Also, the content of the cellulosic surfactant or the cationic surfactant is preferably 1.0 mass % or less based on the total amount of the polishing liquid in view of preventing a reduction in the polishing rate. In view of these, the content of the cellulosic surfactant or the cationic surfactant in the polishing liquid is preferably 0.02 mass % or more and 0.8 mass % or less, more preferably 0.05 mass % or more and 0.5 mass % or less, and even more preferably 0.15 mass % or more and 0.4 mass % or less, based on the total amount of the polishing liquid. In the case where the polishing liquid contains either one of the cellulosic surfactant and the cationic surfactant, the content of the cellulosic surfactant or the cationic surfactant herein refers to the content of the one of the cellulosic surfactant and the cationic surfactant contained. In the case where the polishing liquid contains both the cellulosic surfactant and the cationic surfactant, the content of the cellulosic surfactant or the cationic surfactant herein refers to the total content of the cellulosic surfactant and the cationic surfactant.

Still another feature of the polishing liquid of the present invention is that the polishing liquid has a pH of 5 or more and 11 or less before polishing is performed. When the polishing liquid has a pH of 5 or more, the polishing liquid can provide a C/Si polishing rate ratio close to 1, and also the polishing rates on the C face and on the Si face can be further increased even in the presence of the cellulosic surfactant and the cationic surfactant. Also, when the polishing liquid has a pH of 11 or less, the polishing rates on the C face and on the Si face can be further increased. In view of these, the polishing liquid preferably has a pH of 5.5 or more and 10.0 or less, more preferably 6.0 or more and 9.5 or less, and even more preferably 7.0 or more and 9.0 or less. The pH is measured at 25° C. A pH adjusting agent may be used as needed to adjust the pH of the polishing liquid to be within the above-described pH range. As the pH adjusting agent, a known acid or alkali may be used. Examples of the acid include inorganic acids such as sulfuric acid, nitric acid, and hydrochloric acid and organic acids such as formic acid, acetic acid, and citric acid. Examples of the alkali include alkali metal hydroxides such as sodium hydroxide and potassium hydroxide, ammonium salts such as ammonium chloride, and tetramethylammonium hydroxide.

The inventors of the present invention consider the reason why the above specified pH range of the polishing liquid is preferable as follows.

A silicon carbide substrate tends to polarize into the positive on the Si face and the negative on the C face, due to electronegativity. Accordingly, particularly when the polishing liquid has a low pH, the Si face of a silicon carbide substrate is likely to be negatively charged, and the C face is likely to be positively charged. For this reason, metal oxide abrasive grains, which are negatively charged in an ordinary polishing liquid, are more likely to move toward the C face than to the Si face in a conventional polishing liquid having a pH of less than 5. This is considered to be a cause of increasing the C/Si polishing rate ratio to about 2 or more when a conventional polishing liquid is used. However, the polishing liquid according to the present embodiment has a pH of 5 or more and 11 or less, and thus the C face is likely to be charged negatively and not positively. Therefore, it is considered that the phenomenon that manganese oxide is more likely to move toward the C face than to the Si face is unlikely to occur.

In the polishing liquid according to the present embodiment, the abrasive grains preferably have a zeta potential of −28 mV or less. When the abrasive grains have a zeta potential of −28 mV or less, the polishing liquid can more efficiently provide a C/Si polishing rate ratio close to 1, and thus the occurrence of warpage caused by the Twyman effect and cracking is likely to be prevented. The inventors of the present invention think that, by adjusting the pH of the polishing liquid according to the present embodiment to be in the above-described pH range in which the C face is likely to be negatively charged and also adjusting the zeta potential of the abrasive grains to be a specific value or less as described above, it is possible to cause the abrasive grains to equally move toward the C face and the S face of the silicon carbide substrate. The abrasive grains more preferably have a zeta potential of −35 mV or less. Also, the abrasive grains preferably have a zeta potential of −90 mV or more in view of ease of production of the polishing liquid, and more preferably have a zeta potential of −100 mV or more in view of decreasing the polishing rate on the C face.

The polishing liquid of the present invention contains a dispersion medium for dissolving or dispersing permanganate ions, manganese oxide abrasive grains, and the cellulosic surfactant or the cationic surfactant. As the dispersion medium, water, a water-soluble organic solvent such as an alcohol or a ketone, or a mixture thereof may be used in view of enhancing the effect of increasing the polishing rate. The amount of the dispersion medium in the polishing liquid is preferably 60 mass % or more and 99.9 mass % or less, and more preferably 80 mass % or more and 98 mass % or less.

The polishing liquid of the present invention may contain additives in addition to the permanganate ions, the manganese oxide abrasive grains, the cellulosic surfactant or the cationic surfactant, and the dispersion medium described above. Examples of the additives include a dispersing agent, a pH adjusting agent, a viscosity adjusting agent, a chelating agent, and an antirust agent. The amount of these additive components that can be used in the polishing liquid in addition to the permanganate ions, the manganese oxide abrasive grains, the cellulosic surfactant or the cationic surfactant, and the dispersion medium described above is preferably 40 mass % or less, more preferably 20 mass % or less, and even more preferably 10 mass % or less.

The method for preparing the polishing liquid of the present invention is not limited. It is only necessary to appropriately mix the permanganate ions, the manganese oxide abrasive grains, the cellulosic surfactant or the cationic surfactant, and the dispersion medium, and optionally other additive components. The polishing liquid may be provided in the form of, for example, a kit in which the constituent components are divided into two or more packs. In this case, the kit is configured as appropriate such that the polishing liquid to be prepared can sufficiently exhibit its polishing performance.

The polishing liquid of the present invention is suitably applied to polishing a high-hardness material that has a Mohs hardness of 8 or more. Mohs hardness is on a scale that quantifies hardness of a material on the basis of reference substances in terms of scratch resistance. The reference substances for Mohs hardness are assigned rankings 1 to 10 in ascending order of hardness: 1, talc; 2, gypsum; 3, calcite; 4, fluorite; 5, apatite; 6, orthoclase; 7, quartz; 8, topaz; 9, corundum; and 10, diamond. Mohs hardness can be measured by using a conventional method using a Mohs hardness meter. Examples of the high-hardness material that has a Mohs hardness of 8 or more include silicon carbide (with a Mohs hardness of about 9), gallium nitride (with a Mohs hardness of about 9), and diamond. The polishing liquid of the present invention can be used in, for example, a final CMP (chemical mechanical polishing) process after lapping of a substrate made of a high-hardness material.

The polishing liquid of the present invention is preferably used to polish a silicon carbide substrate because it can provide a high polishing rate and successfully exhibit the effect of preventing the occurrence of warpage caused by the Twyman effect and cracking. As the silicon carbide substrate, a single crystalline silicon carbide substrate is generally used, and the crystal system thereof is normally a hexagonal system or a rhombohedral system. It is preferable for the polishing liquid of the present invention to use a single crystalline silicon carbide substrate whose crystal system is a hexagonal system, in view of the effect of preventing the occurrence of warpage caused by the Twyman effect and cracking. The polytypes of the hexagonal system include 2H, 4H, 6H, 8H, and 10H. The polytypes of the rhombohedral system include 15R.

Hereinafter, a method for polishing a silicon carbide substrate using the polishing liquid of the present invention will be further described.

Conventionally known polishing operations can be adopted in the polishing method of the present invention, and the polishing in the present invention may be single-sided polishing or double-sided polishing.

In particular, double-sided polishing is preferably adopted, in view of reducing the number of production steps to shorten the polishing time, which leads to the cost reduction.

An example of the polishing method involving double-sided polishing will be described with reference to FIGS. 1 and 2.

Figure 1:
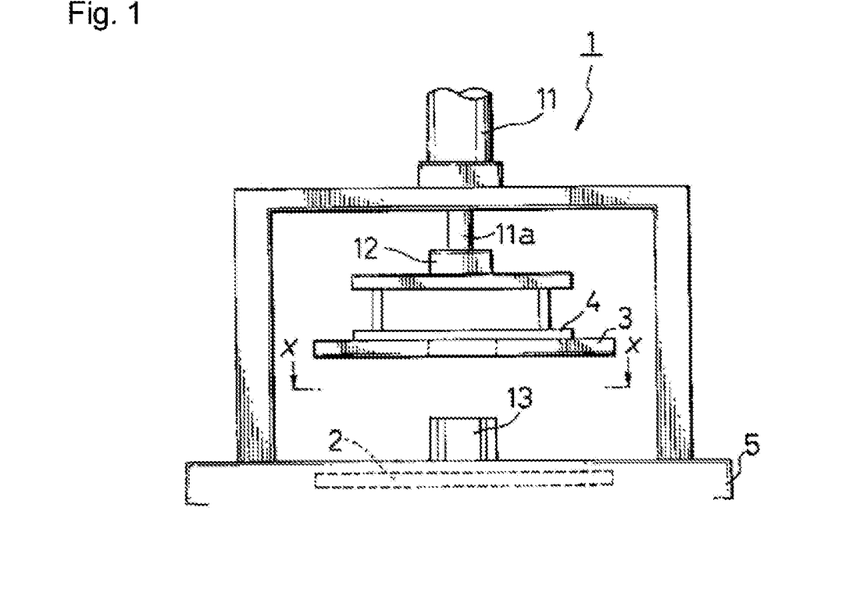
FIG. 1 is a schematic front view illustrating an exemplary double-sided polishing machine used in a polishing step that uses a polishing liquid according to the present invention.

FIG. 1 shows an example of a polishing machine used in the step of polishing with the polishing liquid of the present invention. A double-sided polishing machine 1 shown in FIG. 1 includes a lower platen 2, an upper platen 3 that is provided above the lower platen 2, and a platen supporting member 4 that is in contact with the upper platen 3 and supports the upper platen 3.

As shown in FIG. 1, the upper platen 3 is rotatably attached to the leading end portion of an output rod 11a of an air cylinder 11 via a bracket 12. The upper platen 3 is configured to be capable of being raised and lowered by the air cylinder 11, and to engage with the grooves of a rotor 13, which rotates in the direction indicated by the arrow D shown in FIG. 2, and rotate in the same direction on the side where a base 5 is provided when the upper platen 3 is lowered. Also, polishing pads 20 are provided on the underside of the upper platen 3. In the example shown in Figures, the platen 3 is a pellet-embedded type platen, and small cylindrical polishing pads 20 are attached thereto as a polishing tool. As shown in FIG. 2, a plurality of polishing pads 20 are fixed to the underside of the upper platen 3 at a predetermined interval. However, the shape of the polishing pads 20 and the installation of the polishing pads 20 to the platen are not limited thereto. The upper platen 3 is firmly fixed to the platen support 4 with bolts (not shown) so as to be rotatable with the platen support 4.

Figure 2:
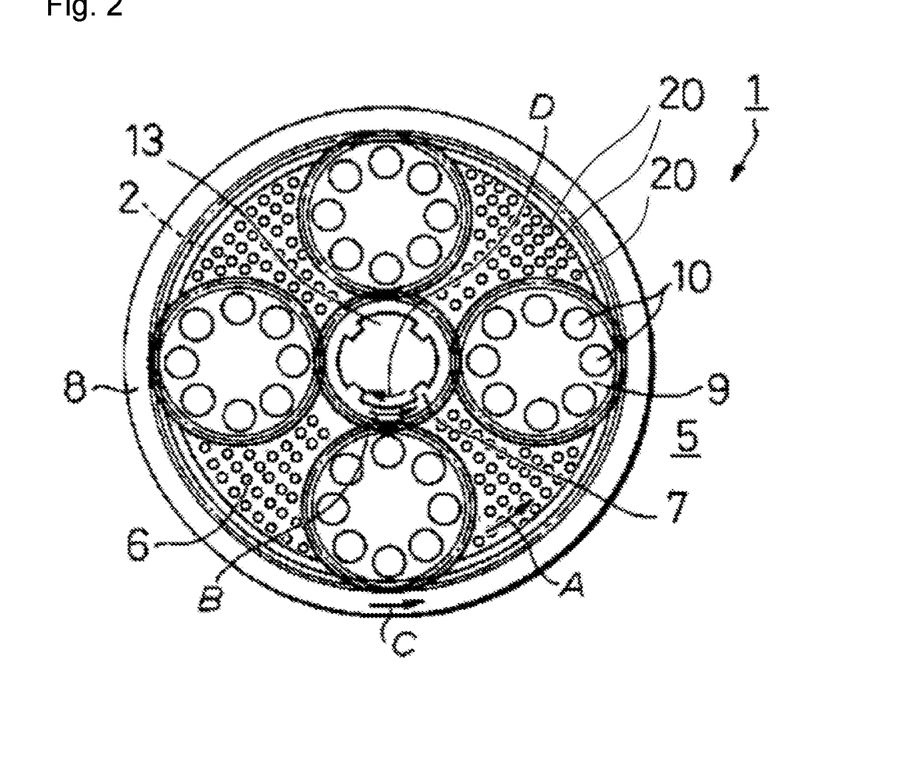
FIG. 2 is a cross-sectional view taken along the X-X line shown in FIG. 1.

As shown in FIG. 2, the lower platen 2 is provided on the base 5 so as to be rotatable in the direction indicated by the arrow A, and polishing pads 20 are provided on the upper surface of the lower platen 2 in the same manner as in the upper platen 3. Also, the lower platen 2 is provided with four planetary gear carriers 9 that revolve while rotating as a result of engagement between a sun gear 7 that is provided at the center and rotates in the direction indicated by the arrow B and an annulus gear 8 that is provided on the outer circumferential side and rotates in the direction indicated by the arrow C. Then, articles 10 to be polished that are plate-shaped silicon carbide substrates are set in eight holes formed in each carrier 9.

A predetermined amount of the polishing liquid containing loose abrasive grains is supplied between the upper platen 3 and the lower platen 2 through a hole or slurry supply pipe (not shown) formed in the upper platen. When the upper platen 3 is lowered by the air cylinder 11, the articles 10 to be polished, which move unitarily with the carriers 9, are sandwiched between the lower platen 2 and the upper platen 3, and polished.

When the polishing liquid is used, for example, the polishing liquid may be supplied to the polishing pads, and the surfaces of the articles to be polished may be brought into contact with the polishing pads and polished by relative motion of the surfaces of the articles to be polished and the polishing pads. The used polishing liquid may be discharged as a waste. Alternatively, the polishing liquid having been supplied to the pad and used for polishing may be recovered and resupplied to the polishing pad in a recirculation system. As the polishing pads, those conventionally used in the pertinent art may be used, including pads made of a non-woven fabric optionally impregnated with a resin such as polyurethane or epoxy and pads made of suede. The polishing pressure is preferably set to $0.5 \times 10^4$ Pa or more and $1.0 \times 10^5$ Pa or less, and more preferably $1.0 \times 10^4$ Pa or more and $5.0 \times 10^4$ Pa or less, in view of the polishing force, and ease of handling of the polishing jig. The flow rate of the polishing liquid is preferably 10 mL/min or more and 1000 mL/min or less, and more preferably 50 mL/min or more and 500 mL/min or less.

The polishing method according to the present invention, in which a specific polishing liquid is used, provides the effects of increasing the polishing rate when polishing silicon carbide and preventing the occurrence of warpage caused by the Twyman effect and cracking, and thus is preferably used to produce, for example, a SiC substrate for epitaxial growth, or an epitaxial SiC on a SiC substrate or a Si substrate.

EXAMPLES

Hereinafter, the present invention will be described in further detail by way of examples. However, it is to be noted that the scope of the present invention is not limited to the examples given below.

Example 1

Pure water, manganese oxide (abrasive grains, $MnO_2$), potassium permanganate ($KMnO_4$), and a sodium salt of carboxymethyl cellulose with a degree of etherification of 0.7 (CMC 1 in Table 1) were mixed to prepare a polishing liquid. The amounts of these components used were such that the resulting polishing liquid had a content of manganese oxide ($MnO_2$) of 2.0 mass %, that of permanganate ions ($MnO_4^-$) of 2.8 mass %, and that of sodium salt of carboxymethyl cellulose (CMC 1) of 0.25 mass %, all based on the total amount of the polishing liquid.

Examples 2 and 3

Polishing liquids were obtained in the same manner as in Example 1, except that the amount of the sodium salt of carboxymethyl cellulose (CMC 1) was changed as shown in Table 1.

Example 4

A polishing liquid was obtained in the same manner as in Example 1, except that, in addition to the components used in Example 1, sulfuric acid was contained in the polishing liquid in an amount such that the polishing liquid had a pH of 6.

Example 5

A polishing liquid was obtained in the same manner as in Example 1, except that, in addition to the components used in Example 1, NaOH was contained in the polishing liquid in an amount such that the polishing liquid had a pH of 11.

Example 6

A polishing liquid was obtained in the same manner as in Example 1, except that, instead of the sodium salt of carboxymethyl cellulose (CMC), a modified product of crystalline cellulose (Avicel® available from Asahi Kasei Corporation) was contained in the polishing liquid in an amount of 0.25 mass % based on the total amount of the polishing liquid.

Example 7

A polishing liquid was obtained in the same manner as in Example 1, except that, instead of the sodium salt of carboxymethyl cellulose (CMC), benzalkonium chloride was contained in the polishing liquid in an amount of 0.25 mass % based on the total amount of the polishing liquid.

Examples 8 and 9

Polishing liquids were obtained in the same manner as in Example 1, except that CMC 1 as a sodium salt of carboxymethyl cellulose (CMC) was changed to CMC 2 or CMC 3 below.

CMC 2: a sodium salt of carboxymethyl cellulose with a degree of etherification of 0.9

CMC 3: a sodium salt of carboxymethyl cellulose with a degree of etherification of 1.2

Comparative Example 1

A polishing liquid was obtained in the same manner as in Example 1, except that the sodium salt of carboxymethyl cellulose (CMC) was not added.

Comparative Example 2

A polishing liquid was obtained in the same manner as in Example 1, except that the sodium salt of carboxymethyl cellulose (CMC) was not added, and that instead, nitric acid was contained in the polishing liquid in an amount of 0.25 mass % based on to the total amount of the polishing liquid.

Comparative Example 3

A polishing liquid was obtained in the same manner as in Example 1, except that the sodium salt of carboxymethyl cellulose (CMC) was not added, and that instead, a 25 mM acetate buffer solution as a buffering agent was contained in the polishing liquid in an amount such that the polishing liquid had a pH of 4.0.

Comparative Example 4

A polishing liquid was obtained in the same manner as in Example 1, except that the sodium salt of carboxymethyl cellulose (CMC) was not added, and that instead, an anion surfactant (sodium polyacrylate (PAA) with a weight average molecular weight Mw of 1200, available from Aldrich) was contained in the polishing liquid in an amount of 0.25 mass % based on the total amount of the polishing liquid.

Comparative Example 5

A polishing liquid was obtained in the same manner as in Example 1, except that the sodium salt of carboxymethyl cellulose (CMC) was not added, and that instead, an anion surfactant (sodium polyacrylate (PAA) with a weight average molecular weight Mw of 15000, available from Aldrich) was contained in the polishing liquid in an amount of 0.25 mass % based on the total amount of the polishing liquid.

Comparative Example 6

A polishing liquid was obtained in the same manner as in Example 1, except that the sodium salt of carboxymethyl cellulose (CMC) was not added, and that instead, polycarboxylic acid (SND 5468 available from San Nopco, Ltd.) as an anion surfactant was contained in the polishing liquid in an amount of 0.25 mass % based on the total amount of the polishing liquid.

Comparative Example 7

A polishing liquid was obtained in the same manner as in Example 1, except that the sodium salt of carboxymethyl cellulose (CMC) was not added, and that instead, polyoxyalkylene (EMALGEN MS-110 available from Kao Corporation) as a nonionic surfactant was contained in the polishing liquid in an amount of 0.25 mass % based on the total amount of the polishing liquid.

Comparative Example 8

A polishing liquid was obtained in the same manner as in Example 1, except that manganese dioxide ($MnO_2$) and the sodium salt of carboxymethyl cellulose (CMC) were not added, and that instead, silica ($SiO_2$) abrasive grains were contained in the polishing in an amount of 2.0 mass % based on the total amount of the polishing liquid.

Comparative Example 9

A polishing liquid was obtained in the same manner as in Example 1, except that manganese dioxide ($MnO_2$) and the sodium salt of carboxymethyl cellulose (CMC) were not added, and that instead, alumina ($Al_2O_3$) abrasive grains were contained in the polishing liquid in an amount of 2.0 mass % based on the total amount of the polishing liquid.

The pH of each of the polishing liquids obtained in Examples 1 to 9 and Comparative Examples 1 to 9 was measured at 25° C. using a pH electrode 9615S-10D available from Horiba, Ltd. before the polishing liquid was used in polishing. Also, the zeta potential of the abrasive grains contained in each of the polishing liquids obtained in Examples 1 to 9 and Comparative Examples 1 to 9 was measured according to the following method. The particle size $D_{50}$ of the abrasive grains was also determined according to the following method. Furthermore, each of the polishing liquids was subjected the following polishing test, which was a model test for simultaneous double sided polishing, to determine the polishing rate. The results are shown in Table 1.

Method for Measuring Zeta Potential

Measurement samples were prepared in the following manner. A mixture was obtained by mixing the components of each of the polishing liquids of Examples and Comparative Examples excluding the oxidizing agent ($KMnO_4$) and water. The resulting mixture was diluted with water to a content of about 0.01% to thereby obtain a measurement sample. The zeta potential of the measurement sample was measured at 20° C. using a zeta potential analyzer (Delsa Nano available from Beckman Coulter, Inc.). The measurement was duplicated, and the average value of the found values thereof was taken as the zeta potential.

$D_{50}$

A mixture was obtained by mixing the components of each of the polishing liquids of Examples and Comparative Examples excluding the oxidizing agent ($KMnO_4$) and water. The resulting mixture was diluted with water to a content of about 0.01% to thereby obtain a measurement sample. The measurement sample was placed in the chamber of a sample circulator MICROTRAC S3500 available from Microtrac BEL Corporation, and the particle size $D_{50}$ of the measurement sample was determined.

Polishing Test

Polishing was performed in the following manner using each of the polishing liquids prepared in Examples and Comparative Examples described above. As the article to be polished, a lapped 4H—SiC substrate having a diameter of 3 inches and an off-angle of 4° was used. Polishing was performed on the Si face of the substrate. As the polishing machine, a single side polishing system BC-15 available from MAT, Inc. was used. As the polishing pad attached to the platen, a polishing pad SUBA #600 (available from Nitta Haas, Inc.) was used. The rotation speed of the platen was set to 60 rpm, and the peripheral speed of the platen was set to 7163 cm/min. The rotation speed of the carrier was set to 60 rpm, and the peripheral speed of the carrier was set to 961 cm/min. The load applied during polishing was set to 3 psi (about $2.07 \times 10^4$ Pa). The polishing liquid was supplied at a flow rate of 200 mL/min. The Si face was polished for one hour, and a mass difference between before and after polishing (mass difference 1) was determined. Then, the C face was also polished for one hour under the same conditions as those for polishing the Si face described above, and a mass difference between before and after polishing (mass difference 2) was determined. The polishing rate (nm/min) on the C face and that on the Si face were calculated from the mass difference 1, the mass difference 2, and SiC density (3.10 g/cm$^3$), and then the C/Si polishing rate ratio was calculated.

Checking Occurrence of Warpage and Cracking

Each polished silicon carbide substrate was placed on a flat surface, with the Si face downward, and visually checked for the occurrence of warpage and cracking.

or alumina abrasive grains were used instead of manganese oxide abrasive grains, the C/Si polishing rate ratio was higher than that in Comparative Example 1. Also, in all of Comparative Examples 1 to 9, warpage occurred in the silicon carbide substrates.

Accordingly, it is clear that, the polishing liquid of the present invention can provide a C/Si polishing rate ratio close to 1 while increasing the polishing rates, and also effectively prevent cracking caused by warpage due to the Twyman effect.

INDUSTRIAL APPLICABILITY

The polishing liquid and the polishing method according to the present invention can efficiently polish a silicon carbide substrate. Also, when the polishing liquid is used for double-sided polishing on a silicon carbide substrate, the polishing liquid and the polishing method can provide a C/Si polishing rate ratio close to 1, and thus effectively prevent

TABLE 1

| | Abrasive grains | Oxidizing agent | Surfactant | Additional component | pH | Zeta potential (mv) | D50 (μm) | Polishing rate on Si face (nm/min) | Polishing rate on C face (nm/min) | C/Si polishing rate ratio | Occurrence of warpage and cracking |
|---|---|---|---|---|---|---|---|---|---|---|---|
| Ex. 1 | MnO$_2$ | KMnO$_4$ | CMC 1 (0.25 mass %) | — | 8 | −72.1 | 3.44 | 12.8 | 15.7 | 1.2 | No warpage occurred |
| Ex. 2 | | | CMC 1 (0.13 mass %) | — | 8 | −59.0 | 3.24 | 13.1 | 20.0 | 1.5 | |
| Ex. 3 | | | CMC 1 (0.06 mass %) | — | 8 | −57.7 | 2.74 | 13.1 | 20.0 | 1.5 | |
| Ex. 4 | | | CMC 1 (0.25 mass %) | Sulfuric acid | 6 | −65.3 | 2.99 | 10.2 | 19.3 | 1.9 | |
| Ex. 5 | | | CMC 1 (0.25 mass %) | NaOH | 11 | −64.4 | 3.13 | 11.2 | 17.2 | 1.5 | |
| Ex. 6 | | | Crystalline cellulose | — | 8 | −43.3 | 2.86 | 12.5 | 20.1 | 1.6 | |
| Ex. 7 | | | Benzalkonium chloride | — | 8 | −28.2 | 2.46 | 12.8 | 20.4 | 1.6 | |
| Ex. 8 | | | CMC 2 (0.25 mass %) | — | 8 | −61.4 | 4.26 | 11.6 | 16.4 | 1.4 | |
| Ex. 9 | | | CMC 3 (0.25 mass %) | — | 8 | −79.4 | 10.48 | 8.9 | 16.2 | 1.8 | |
| Comp. Ex. 1 | | | None | — | 8 | −33.3 | 0.29 | 14.3 | 28.6 | 2.0 | Warpage occurred |
| Comp. Ex. 2 | | | | Nitric acid | 4 | −29.2 | 0.33 | 14.7 | 29.4 | 2.0 | |
| Comp. Ex. 3 | | | Buffering agent | — | 4 | −21.8 | 0.33 | 11.9 | 39.4 | 3.3 | |
| Comp. Ex. 4 | | | PAA with Mw1200 | — | 8 | −21.0 | 2.87 | 8.4 | 25.8 | 3.1 | |
| Comp. Ex. 5 | | | PAA with Mw15000 | — | 8 | −61.2 | 2.90 | 7.7 | 24.9 | 3.2 | |
| Comp. Ex. 6 | | | Polycarboxylic acid | — | 8 | −58.9 | 2.84 | 6.5 | 29.3 | 4.5 | |
| Comp. Ex. 7 | | | Polyoxyalkylene | — | 8 | −32.0 | 2.46 | 8.0 | 15.9 | 2.0 | |
| Comp. Ex. 8 | SiO$_2$ | | None | — | 8 | −40.3 | 0.36 | 10.0 | 39.0 | 3.9 | |
| Comp. Ex. 9 | Al$_2$O$_3$ | | | — | 8 | −19.4 | 0.40 | 11.5 | 48.2 | 4.2 | |

As can be clearly seen from the results shown in Table 1, the C/Si polishing rate ratio when using any of the polishing liquids of Examples was 1.9 or less, which was much closer to 1 than that when using any of conventional polishing liquids, which was about 3. Moreover, when using the polishing liquids of Examples, the polishing rate on the Si face and the polishing rate on the C face were high, and there was no occurrence of warpage and cracking. In contrast, the C/Si polishing rate ratio when using the polishing liquids of Comparative Examples 1 to 3, which contains manganese oxide abrasive grains but no surfactant, was 2.0 or more. In Comparative Examples 4 to 7, in which surfactants other than the specific types of surfactants according to the present invention were used, the polishing rate on the Si face decreased significantly, and therefore the C/Si polishing rate ratio was higher than that in Comparative Example 1. Likewise, in Comparative Examples 8 and 9, in which silica the occurrence of warpage caused by the Twyman effect and/or cracking caused by the warpage.

The invention claimed is:
1. A polishing method comprising a step of polishing a silicon carbide substrate with a polishing liquid, wherein the polishing liquid comprises:
  manganese dioxide (MnO$_2$) abrasive grains having a zeta potential of −28 mV or less and −100 mV or more;
  permanganate ions; and
  a carboxymethyl cellulose or a derivative thereof,
  wherein the polishing liquid has a pH of 5 or more and 11 or less,
  wherein a degree of etherification of the carboxymethyl cellulose or the derivative thereof is in a range of 0.3 to 0.8, wherein the manganese dioxide ($MnO_2$) abrasive grains have a particle size at 50% cumulative volume percentage of 0.1 μm or more and 5.0 μm or less in a particle size distribution determined by a laser diffraction/scattering method, wherein a content of manganese dioxide ($MnO_2$) abrasive grains in the polishing liquid is 0.1 mass % or more and 10 mass % or less, wherein a content of permanganate ions in the polishing liquid is 0.1 mass % or more and 20.0 mass % or less, and wherein a content of a carboxymethyl cellulose or a derivative thereof in the polishing liquid is 0.01 mass % or more and 1.0 mass % or less.

* * * * *